US008189393B2

(12) United States Patent
Lee

(10) Patent No.: US 8,189,393 B2
(45) Date of Patent: May 29, 2012

(54) NONVOLATILE MEMORY DEVICE WITH INCREMENTAL STEP PULSE PROGRAMMING

(75) Inventor: Seung Won Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 360 days.

(21) Appl. No.: 12/619,227

(22) Filed: Nov. 16, 2009

(65) Prior Publication Data

US 2010/0124123 A1 May 20, 2010

(30) Foreign Application Priority Data

Nov. 19, 2008 (KR) ........................ 10-2008-0115151

(51) Int. Cl.
*G11C 11/34* (2006.01)

(52) U.S. Cl. .......... 365/185.22; 365/185.23; 365/189.07

(58) Field of Classification Search ............. 365/185.22, 365/189.07
See application file for complete search history.

(56) References Cited

U.S. PATENT DOCUMENTS

| 5,357,462 | A | 10/1994 | Tanaka et al. |
| 5,570,315 | A | 10/1996 | Tanaka et al. |
| 6,031,760 | A * | 2/2000 | Sakui et al. ............... 365/185.21 |
| 7,274,599 | B2 | 9/2007 | Lee |
| 7,417,896 | B2 * | 8/2008 | Cho et al. ................. 365/185.18 |
| 7,468,907 | B2 * | 12/2008 | Kang et al. ............... 365/185.03 |

FOREIGN PATENT DOCUMENTS

| JP | 05-144277 | 6/1993 |
| JP | 07-093979 | 4/1995 |
| JP | 2006-294217 | 10/2006 |
| KR | 1995-0003348 | 4/1995 |
| KR | 0169267 | 2/1999 |
| KR | 10-0706245 | 4/2007 |

OTHER PUBLICATIONS

English Abstract for Publication No. 05-144277.
English Abstract for Publication No. 07-093979.
English Abstract for Publication No. 1995-003348.
English Abstract for Publication No. 0169267.
English Abstract for Publication No. 2006-294217.
English Abstract for Publication No. 1020060108430 (for 10-0706245).

* cited by examiner

*Primary Examiner* — Alexander Sofocleous
(74) *Attorney, Agent, or Firm* — F. Chau & Associates, LLC

(57) ABSTRACT

A nonvolatile memory device includes a sense amplifier circuit sensing first data from a memory cell via a bit line and outputting the sensed first data, in response to a read command. A write driver circuit programs the memory cell and stores second data indicating a programming state of the memory cell, in response to a program command. A verification block outputs a result of a comparison between the first and second data in response to a first read command. The second data is updated based on the determination on the programming of the memory cell in response to a second read command applied following the first read command.

20 Claims, 8 Drawing Sheets

NONVOLATILE MEMORY DEVICE WITH INCREMENTAL STEP PULSE PROGRAMMING

CROSS-REFERENCE TO RELATED APPLICATIONS

This application claims priority to Korean Patent Application No. 10-2008-0115151, filed on Nov. 19, 2008, in the Korean Intellectual Property Office, the disclosure of which is incorporated herein in its entirety by reference.

BACKGROUND

1. Technical Field

The inventive concept relates to a nonvolatile memory device, and more particularly, to a nonvolatile memory device performing a programming operation according to incremental step pulse programming (ISPP).

2. Discussion of the Related Art

Semiconductor memory devices (hereafter, "memory devices") include volatile memory devices and non-volatile memory devices. Volatile memory devices are generally characterized by fast data access and write speeds, but lose stored data in the absence of applied power. In contrast, non-volatile memory devices generally provide slower data access and write speeds but retain stored data in the absence of applied power. Examples of nonvolatile memory devices include phase-change random access memory (PRAM), mask read-only memory (MROM), programmable read-only memory (PROM), erasable programmable read-only memory (EPROM), electrically erasable programmable read-only memory (EEPROM), and flash memory device.

Recently, flash memory devices have widely employed ISPP to program a memory cell by increasing, step-by-step, a voltage applied to a word line of the memory cell. According to a method of programming a memory cell by using Fowler Nordheim (FN) tunneling, the size of a write buffer is relatively large, while the amount of data to be read by using a sense amplifier is relatively small.

Accordingly, when the verification of the memory cell is performed, a relatively large of time is needed to update the write buffer with data that is read by the sense amplifier. Also, since data read time and write buffer update time are occur separately, the overall programming time is prolonged due to the read and update time when the ISPP is performed.

SUMMARY

The inventive concept provides a nonvolatile memory device which may shorten the programming time by decreasing the time to verify whether a memory cell is programmed or not.

According to an aspect of the inventive concept, there is provided a nonvolatile memory device including a sense amplifier circuit sensing first data from a memory cell via a bit line and outputting the sensed first data in response to a read command. A write driver circuit programs the memory cell and stores second data indicating the state of programming of the memory cell in response to a program command. A verification block outputs a result of a comparison between the first and second data in response to a first read command and updates the second data based on whether the memory cell is programmed in response to a second read command applied following the first read command.

The sense amplifier circuit may include a sense amplifier sensing the first data stored in the memory cell and at least one first switching element selectively outputting the first data. The write driver circuit may include a write buffer storing the second data and at least one second switching element selectively outputting the first data output from the verification block to the write buffer.

The verification block may include a comparison block receiving and comparing the first and second data and outputting a result of the comparison and a control block selectively outputting the first data to the write buffer based on a logical value of the first data and a control signal. The comparison block may include a logic gate performing an OR operation on the first and second data. The control block may output the first data to the write buffer when the logical value of the first data is a first logical value and the control signal is active, and block the first data from being outputted to the write block when the logical value of the second data is a second logical value.

The control block may include a first control block selectively outputting the first data based on the logical value of the first data and a second control block selectively outputting the first data output from the first control block to the write buffer in response to the control signal. The first control block may include a third switching element which is switched in response to the logical value of the first data. The second control block comprises a fourth switching element which is switched in response to the control signal. When the nonvolatile memory device performs a verification operation, an active section of the read command, a short-circuited section of the at least one first switching element, and a short-circuited section of the at least one second switching element may be the same, and the active section of the control signal may be included in an active section of the second read command.

According to an aspect of the inventive concept, there is provided a semiconductor memory system including a central processing unit (CPU), a system memory, a system bus, and a nonvolatile memory device. The nonvolatile memory device includes a sense amplifier, a write driver, and a verification block.

The sense amplifier circuit may sense first data from a memory cell via a bit line and outputting the sensed first data. The write driver may program the memory cell and storing second data indicating a state of programming of the memory cell, in response to a program command. The verification block may output a result of a comparison between the first and second data in response to a first read command, and update the second data based on the state of programming of the memory cell in response to a second read command applied following the first read command.

According to an aspect of the inventive concept, there is provided a method for programming a nonvolatile memory device comprising sensing a first data from a memory cell via a bit line using a sense amplifier and outputting the sensed first data in response to a read command, programming the memory cell using a write driver circuit and storing second data including a state of programming of the memory cell, in response to a program command, and outputting a result of a comparison between the first and second data in response to a first section of the read command, using a verification block, and updating the second data based on the state of programming of the memory cell in response to a second section of the read command that is applied following the first section of the read command.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
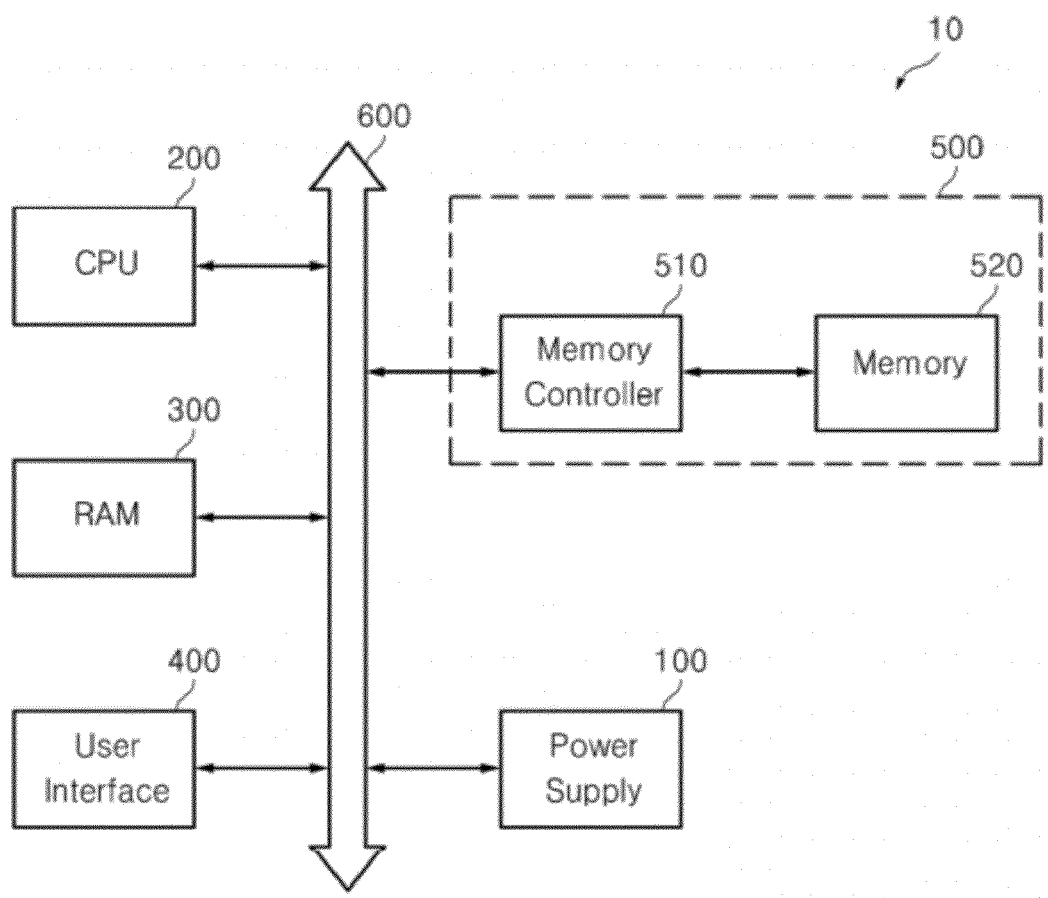
FIG. 1 is a block diagram of an electronic system according to an exemplary embodiment of the present inventive concept.

The attached drawings illustrate exemplary embodiments of the present inventive concept. Hereinafter, exemplary embodiments of the present inventive concept are explained with reference to the attached drawings. Like reference numerals in the drawings may denote like elements.

FIG. 1 is a block diagram of an electronic system 10 according to an exemplary embodiment of the present inventive concept. In FIG. 1, the electronic system 10 may be a system such as a mobile device, a laptop computer, or a desktop computer. Referring to FIG. 1, the electronic system 10 according to the present exemplary embodiment may include a nonvolatile memory system 500, a power supply 100, a central processing unit (CPU) 200, a RAM 300, a user interface 400, and a system bus 600 electrically connecting these elements.

The CPU 200 controls the overall operation of the electronic system 10. The RAM 300 stores information needed for the operation of the electronic system 10. The RAM 300 is commonly referred to as main memory or system memory and may be volatile memory. The RAM is distinct from the nonvolatile memory device 520 of the nonvolatile memory system 500, which may be referred to as mass storage. The user interface 400 provides a user with an interface to the electronic system 10. The power supply 100 supplies electric power to the internal constituent elements such as the CPU 200, the RAM 300, the user interface 400, and the nonvolatile memory system 500.

Figure 2:
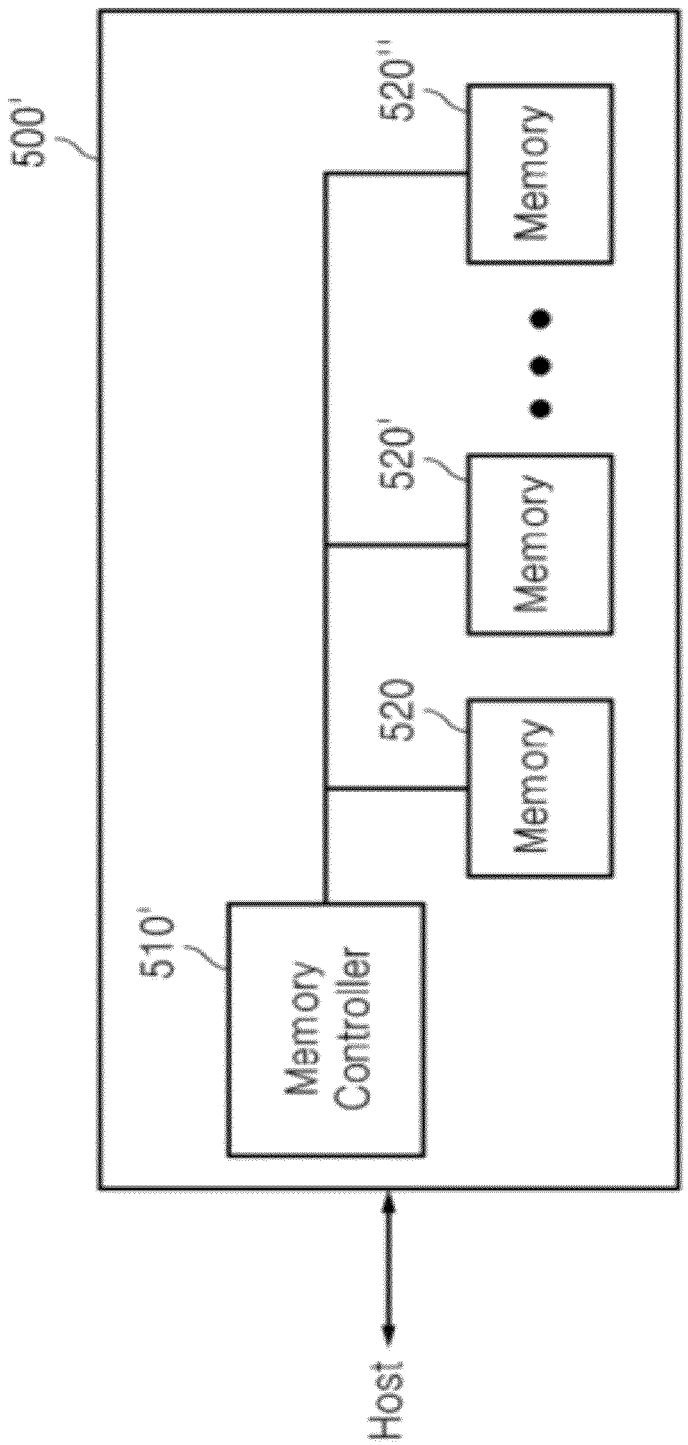
FIG. 2 is a block diagram of a nonvolatile memory system of the electronic system of FIG. 1, according to an exemplary embodiment of the present inventive concept.

FIG. 2 is a block diagram of a nonvolatile memory system 500' of the electronic system 10 of FIG. 1, according to an exemplary embodiment of the present inventive concept. In FIG. 1, the nonvolatile memory system 500 includes a memory controller 510 and a nonvolatile memory device 520, and the memory controller 510 controls the nonvolatile memory device 520. However, the nonvolatile memory system may include a plurality of nonvolatile memories. That is, referring to FIG. 2, the nonvolatile memory system 500' according to an exemplary embodiment, includes the memory controller 510' and a plurality of nonvolatile memory devices 520, 520', ..., 520'' that are controlled by the memory controller 510'.

Figure 3:
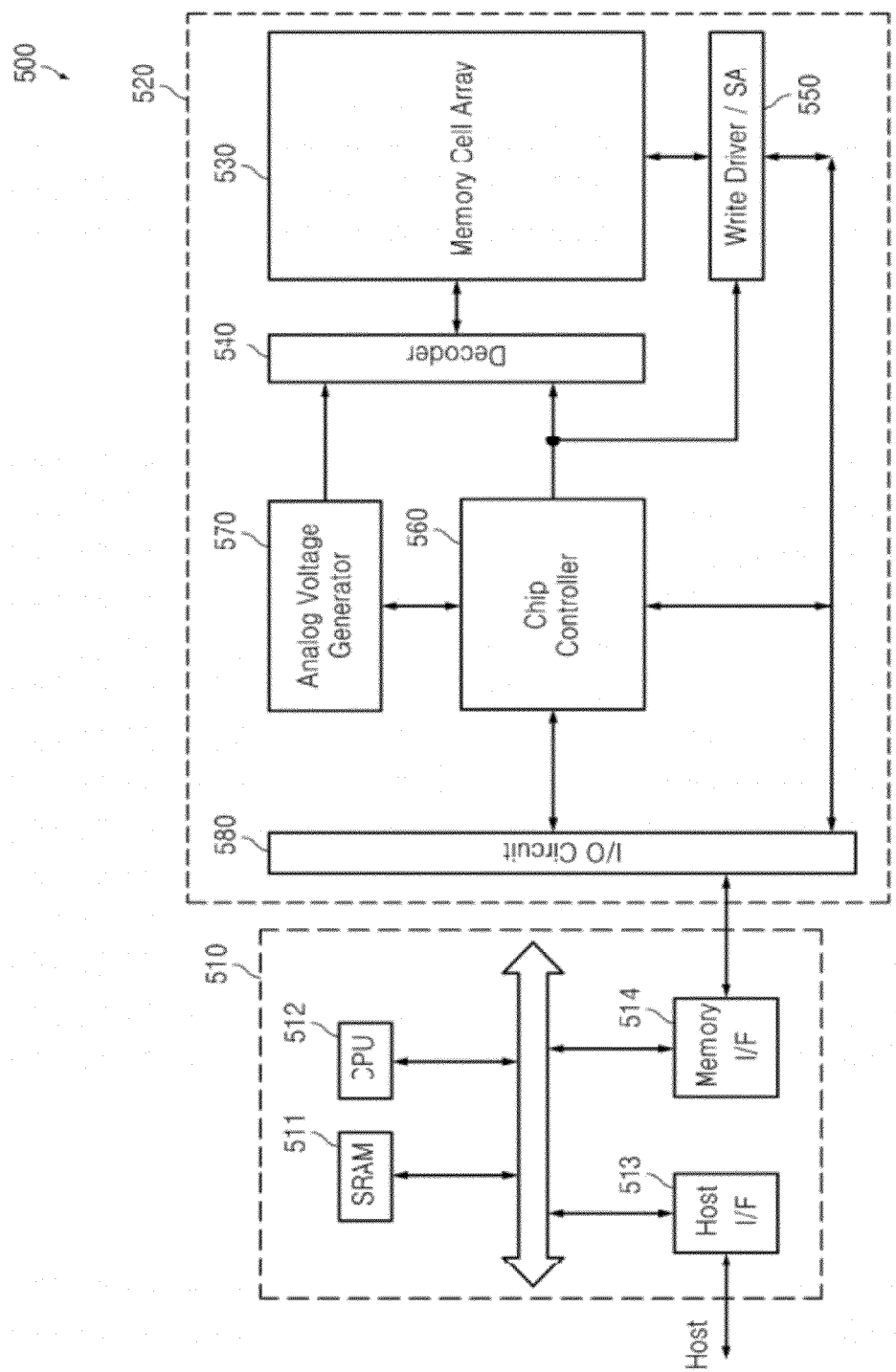
FIG. 3 is a block diagram of a nonvolatile memory system according to an exemplary embodiment of the present inventive concept.

FIG. 3 is a block diagram of the nonvolatile memory system 500 according to an exemplary embodiment of the present inventive concept. Referring to FIG. 3, the nonvolatile memory system 500 includes the nonvolatile memory device 520 and the memory controller 510 controlling the nonvolatile memory device 520. The memory controller 510 may include a static random access memory (SRAM) 511, a central processing unit (CPU) 512, a host interface (I/F) 513, and a memory I/F 514.

The SRAM 511 is used as an operation memory of the CPU 512. The host I/F 513 includes a data exchange protocol of a host connected to the nonvolatile memory system 500. The memory I/F 514 interfaces with the nonvolatile memory device 520 according to an exemplary embodiment of the present inventive concept. The CPU 512 performs generation control operations to read/write data with respect to the nonvolatile memory device 520. Although not illustrated in the drawings, the nonvolatile memory system 500 may further include a ROM for storing code data to interface with the host.

The nonvolatile memory device 520 may include a memory cell array 530, a decoder 540, a write driver/sense amplifier (SA) circuit 550, a chip controller 560, a voltage generator 570, and an input/output (I/O) circuit 580. The memory cell array 530 may be used for storing various data.

The decoder 540, in response to a plurality of row addresses, may select one of the word lines and supply a first operation voltage to the selected word line and a second operation voltage to each of unselected word lines. For example, in a programming mode, the decoder 540 supplies the first operation voltage, for example, a program voltage, to the selected word line and the second operation voltage, for example, a pass voltage, to each to the unselected word lines. The program voltage may be, for example, 15V to 20V, while the pass voltage may be, for example, 10V.

Also, in a reading mode, the decoder 540 may supply a first operation voltage, for example, a ground voltage, to the selected word line and the second operation voltage, for example, a read voltage, to each to the unselected word lines. The read voltage may be, for example, 4.5V. The program voltage may be higher than the pass voltage, while the pass voltage may be higher than the read voltage.

The write driver/SA circuit 550 is selectively connected to a plurality of bit lines to write (i.e., program) data to appointed memory cells or read out data from the appointed memory cells by sensing and amplifying the data. The write driver/SA circuit 550 may include a plurality of data storage devices (not shown) to store a data set to be programmed during a programming operation and a data set read out from the memory cells during a reading operation. Each of the data storage devices may be implemented by a plurality of latches. The data storage devices may store the data set read out during a program verification operation.

A switch block (not shown) to selectively connect a write driver or a sense amplifier to the bit lines may be provided between the write driver/SA circuit 550 and the memory cell array 530. The voltage generator 570 generates a voltage, for example, the above described program voltage, pass voltage, and read voltage, needed for the operation of the nonvolatile memory device 520.

The chip controller 560, in response to an externally provided command, outputs internal control signals (not shown) to control the operation, for example, a programming operation, an erasure operation, and a reading operation, of the nonvolatile memory device 520. In the nonvolatile memory device 520, N-bit data, where N is an integer greater than 1, that is provided through the user interface 400 or processed or to be processed by the CPU 200, is stored via the memory controller 510.

Although in the above-described embodiment the memory controller 510 and the nonvolatile memory device 520 are described as a single memory system, the nonvolatile memory system 500, the memory controller 510 and the nonvolatile memory device 520 may be configured separately from each other. For example, the memory controller 510 and the nonvolatile memory device 520 may constitute a solid state drive/disk (SSD) using a nonvolatile memory, to store data. Also, the memory controller 510 may be implemented in the host.

Figure 4:
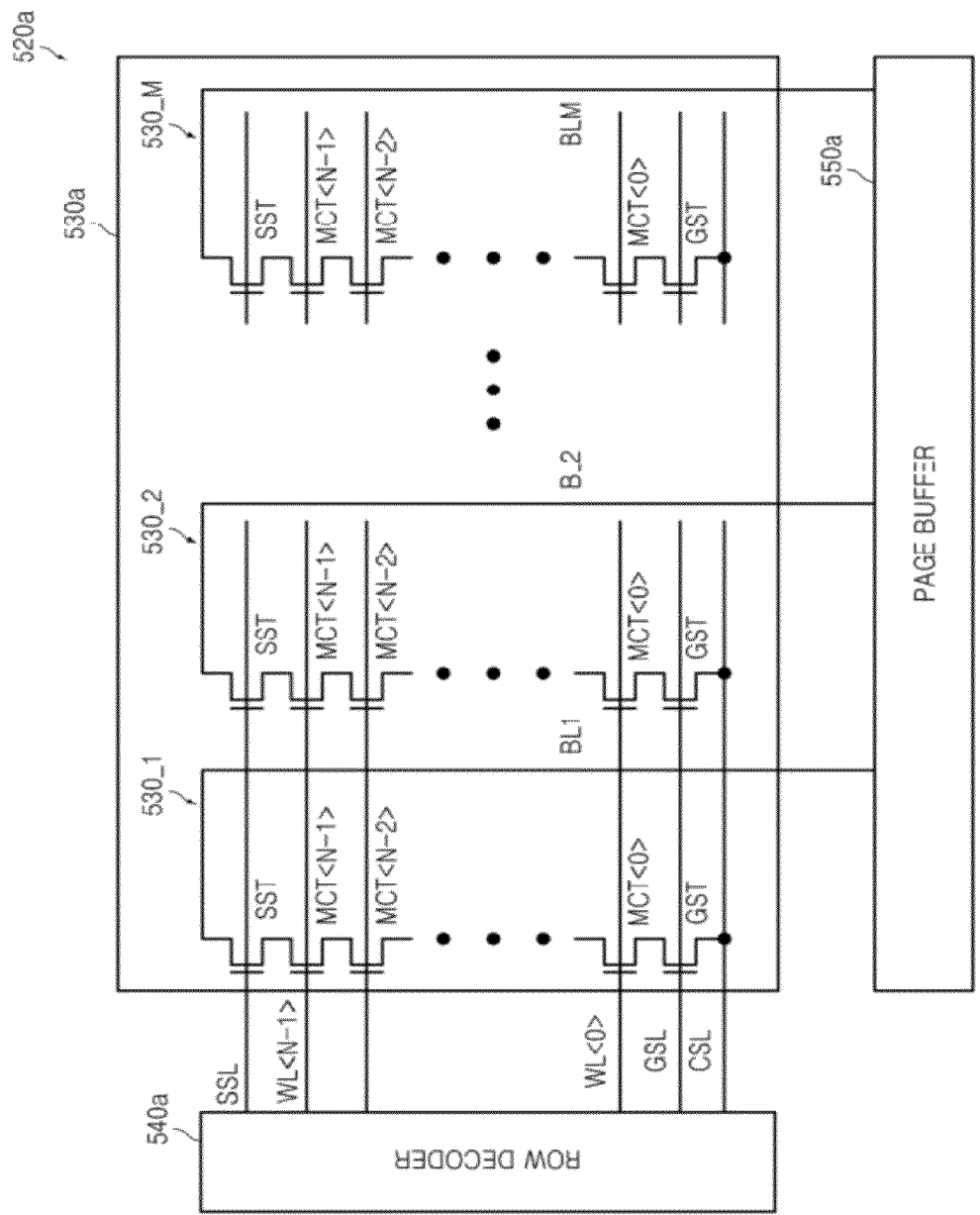
FIG. 4 is a block diagram of a nonvolatile memory device according to an exemplary embodiment of the present inventive concept.

FIG. 4 is a block diagram of a nonvolatile memory device 520a according to an exemplary embodiment of the present inventive concept. Although in FIG. 4 the nonvolatile memory device 520a is shown as a NAND type flash memory device, the present inventive concept is not limited thereto. The nonvolatile memory device 520a includes a memory cell array 530a, a row decoder 540a, and a page buffer circuit 550a.

The memory cell array 530a is divided into a plurality of memory blocks (not shown). Each memory block includes a plurality of strings 530_1 to 530_M extending in a direction along the row. FIG. 4 illustrates only a single memory block for convenience of explanation. Each string includes a string selecting transistor (SST), a ground selecting transistor (GST), and a plurality of memory cell transistors MCT<0> to MCT<N−1> serially connected between the SST and the GST.

The gate of the SST is connected to a string selection line (SSL) and the drain thereof is connected to an appropriate one of a plurality of bit lines BL1, BL2, . . . , BLM. The gate of the GST is connected to a ground selection line (GSL) and the source thereof is connected to a common source line (CSL). The control gates of the memory cell transistors MCT<0> to MCT<N−1> are respectively connected to a plurality of word lines WL<0> to WL<N−1>.

The voltage levels of the lines SSL, WL<0> to WL<N−1>, and GSL are controlled by the row decoder 540a in response to a predetermined timing control signal (not shown). The voltage levels of the bit lines BL1, BL2, . . . , BLM are controlled by a plurality of page buffers (not shown) provided in the page buffer circuit 550a.

Figure 5:
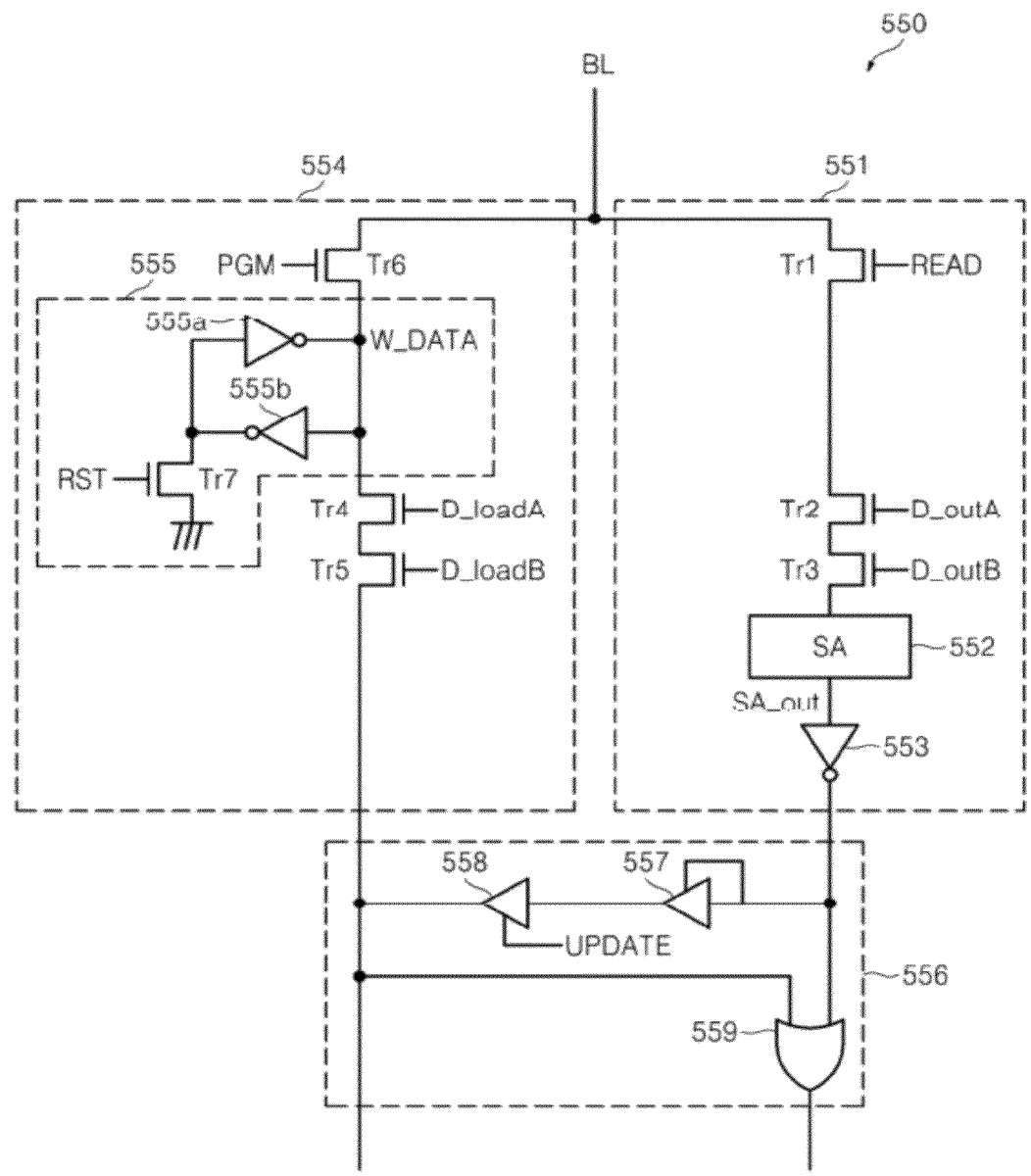
FIG. 5 is a circuit diagram of the write driver/SA circuit of FIG. 3 according to an exemplary embodiment of the present inventive concept.

FIG. 5 is a circuit diagram of the write driver/SA circuit 550 of FIG. 3. Although in FIG. 5 the write driver/SA circuit 550 is shown as being included in a NOR type flash memory device, the present inventive concept is not limited thereto. Referring to FIG. 5, the write driver/SA circuit 550 includes a sense amplifier circuit 551, a write driver circuit 554, and a verification block 556.

The sense amplifier circuit 551 may sense and output first data from an appropriate one of the memory cells included in the memory cell array 530 via the bit lines BL, in response to a read command READ. The sense amplifier circuit 551 may include a sense amplifier 552, at least one switching elements Tr1, Tr2, and Tr3, and an inverter 553. The sense amplifier 552 may sense the first data stored in the appropriate memory cell. The at least one switching elements Tr1, Tr2, and Tr3 may selectively output the first data.

A single switching element, for example, the switching element Tr1, may be sufficient to selectively output the first data. However, to reduce the amount of encoding performed for data output, the sense amplifier circuit 551 may further include a plurality of switching elements, for example, the switching elements Tr2 and Tr3. Each of the switching elements may be implemented by a first transistor Tr1 gated in response to the read command READ, a second transistor Tr2 gated in response to a first data output signal D_outA, and a third transistor Tr3 gated in response to a second data output signal D_outB.

The read command READ, the first data output signal D_outA, and the second data output signal D_outB may have the same active section. The first data output signal D_outA and the second data output signal D_outB may be signals received from the memory controller 510 or the chip controller 560.

When the memory cell is programmed, the logical value of the first data output from the sense amplifier 552 is "0". Otherwise, the logical value of the first data is "1". The inverter 553 may invert and output the logical value of the first data output from the sense amplifier 552.

The write driver circuit 554 may program a memory cell included in the memory cell array 530 in response to a program command PGM, and store second data indicating the programming of the memory cell. The write driver circuit 554 may include a write buffer 555, a switching element Tr4 gated in response to the program command PGM, and at least one switching elements Tr5 and Tr6 to selectively transfer the first data output from the verification block 556 to the write buffer 555.

The write buffer 555 may store second data W_DATA indicating the state of programming of the memory cell. For example, when the programming operation is performed on the memory cell, the second data stored in the write buffer 555 has a logical value of "0". When the verification on the programming of the memory cell is completed, the logical value of the second data stored in the write buffer 555 is "1".

The write buffer 555 may include a pair of inverters 555a and 555b connected reversely and in parallel. The write buffer 555 may further include a transistor Tr7 to reset the write buffer 555 in response to a reset signal RST.

A single switching element, for example, the switching element Tr4 or Tr5, is sufficient to selectively output the first data output from the verification block 556. However, to reduce the amount of encoding that is performed, the write driver circuit 554 may further include a plurality of switching elements, for example, the switching elements Tr4 and Tr5. A first data load signal D_loadA and a second data load signal D_loadB may be signals received from the memory controller 510 or the chip controller 560. The first data load signal D_loadA and the second data load signal D_loadB may have the same active section.

Each of the switching elements Tr4 and Tr5 may be implemented by a fourth transistor Tr4 gated in response to the first data load signal D_loadA and a fifth transistor Tr5 gated in response to the second data load signal D_loadB. The switching element Tr6 is short-circuited when the programming operation is performed on the memory cell in response to the program command PGM and is open when the programming operation on the memory cell is completed.

The verification block 556 may output a result of a comparison between the first data output from the sense amplifier 552 and the second data stored in the write buffer 555, in response to a first read command. Also, the verification block 556 may update the second data based on whether the memory cell is programmed, in response to a second read command applied following the first read command.

The verification block 556 may include a comparison block 559 and control blocks 557 and 558. The comparison block 559 may output a result of the comparison between the first and second data to the memory controller 510 or the chip controller 560.

The comparison block 559 may be implemented by a logic gate, for example, an OR gate, performing an OR-operation on the first and second data. Then, the memory controller 510 or the chip controller 560 may determine the programming of the memory cell based on the comparison result between the first and second data.

For example, when the memory cell is programmed, the sense amplifier 552 outputs the first data having a logical value of "0" in response to the read command READ, which the inverter 553 outputs the first data having a logical value of "1". The write buffer 555 stores the second data having the logical value of "0". The comparison block 559 may output the logical value of "1" that is a result of the OR operation performed on the first and second data. Thus, the memory cell may be determined to be programmed.

However, when the memory cell is not programmed, the sense amplifier 552 outputs the first data having the logical value of "1" and the inverter 553 outputs the first data having the logical value of "0". The write buffer 555 stores the second data having the logical value of "0". The comparison block 559 may output the logical value of "0" that is a result of the AND operation performed on the first and second data. Thus, the memory cell may be determined not to be programmed.

The control blocks 557 and 558 may selectively output the first data to the write buffer 555 based on the logical value of the first data and a control signal UPDATE. The control blocks 557 and 558 may output the first data to the write buffer 555 when the logical value of the first data is a first logical value and the control signal UPDATE is active, and block the output of the first data to the write buffer 555 when the logical value of the second data is a second logical value.

The control blocks 557 and 558 may include a first control block 557 and a second control block 558. The first control block 557 may selectively output the first data based on the logical value of the first data. The second control block 558 may selectively output the first data from the first control block 557 to the write buffer 555 in response to the control signal UPDATE.

The first and second control blocks 557 and 558 may be respectively implemented by using a first buffer and a second buffer that operate in response to the logical value of the first data and the control signal UPDATE. As illustrated in FIG. 5, each of the control blocks 557 and 558 may be implemented by a tristate buffer.

The first and second control blocks 557 and 558 may be implemented by using the third switching element and the fourth switching element that are switched in response to the logical value of the first data and the control signal UPDATE.

For example, when the memory cell is programmed, the inverter 553 of the sense amplifier circuit 551 outputs the first data having the logical value of "1". Then, the first control block 557 buffers the first data and the second control block 558 buffers the first data in a section where the control signal UPDATE is active. However, when the memory cell is not programmed, the inverter 553 of the sense amplifier circuit 551 outputs the first data having the logical value of "1". Then, the first control block 557 blocks the first data from being output to the second control block 558.

When the verification operation is performed, the active section of the read command READ, the short-circuit section of the at least one of the first switching elements Tr1, Tr2, and Tr3, and the short-circuit section of the at least one of the second switching elements Tr4 and Tr5 may be the same. The active section of the control signal UPDATE may be included in the active section of the second read command. The verification operation of the nonvolatile memory device 500 will be described in detail with reference to FIG. 6.

Figure 6:
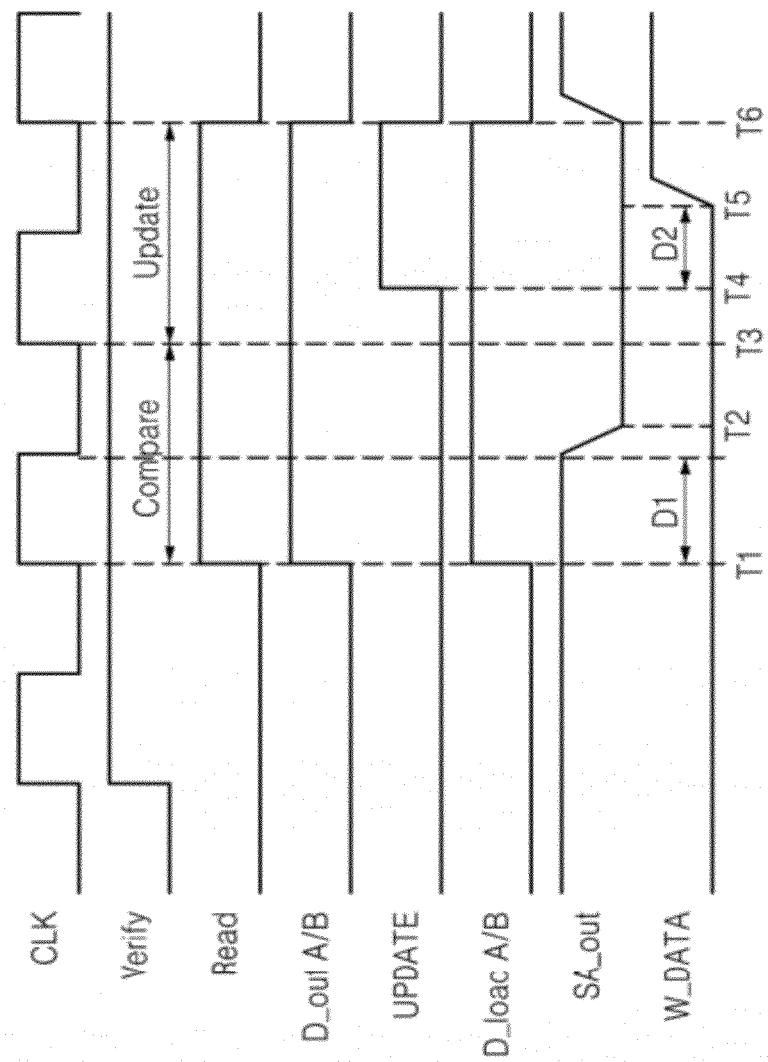
FIG. 6 is a timing diagram illustrating the operation of the nonvolatile memory device of FIG. 5.

FIG. 6 is a timing diagram illustrating the verification operation of the nonvolatile memory device 520 of FIG. 5. The timing diagram of FIG. 6 is based on the assumption that the programming has been normally performed on the memory cell. The operation process thereof is described below with reference to FIGS. 1-6.

The nonvolatile memory device 520 operates based on a clock signal CLK. The nonvolatile memory device 520 starts a verification operation in response to a verification signal Verify. When the read command READ and the data output signals D_outA/B are active, the sense amplifier circuit 551 outputs the first data sensed from the memory cell.

The read command READ may include a comparison section Compare and an update section Update. The section of the read command READ corresponding to the comparison section Compare from T1 to T3 is referred to as the first read command. The section of the read command READ corresponding to the update section Update from T3 to T6 is referred to as a second read command. Referring to FIG. 6, it can be seen that the first read command and the second read command are continuously applied. However, the second read command may be applied at a predetermined interval from the first read command according to the characteristic of the nonvolatile memory device 520 and the operation environment.

When the first read command and the data output signal D_outA/B are active at the time point T1, the logical value of the first data output from the sense amplifier 552 is shifted to the logical value of "0" after a predetermined delay time D1 passes. Then, the first data is inverted by the inverter 553 has the logical value of "1" after the time point T2. The sense amplifier 552 is assumed to output the first data having the logical value of "1", as an invalid value. Also, the data load signal D_loadA/B is active at the time point T1 so that the write buffer 555 may output the second data W_DATA having the logical value of "0".

Thus, the comparison block 559 outputs the logical value of "1" that is a result of the OR operation on the first data having the logical value of "1" and the second data W_DATA having the logical value of "0" in the section between T2 and T3. As a result, the memory controller 510 or the chip controller 560 may determine that the memory cell is programmed.

When the control signal UPDATE is active at the time point T4 after the time point T3 when the active second read command is applied, the control blocks 557 and 558 output the first data having the logical value of "1" to the write buffer 555. Then, the logical value of the write buffer 555 is shifted to the logical value of "1" from the time point T5 after a predetermined delay time D2 passes, and thus that the verification operation is completed at the time point T6. That is, for the normally programmed memory cell, the second data W_DATA stored in the write buffer 555 is updated from the logical value of "0" to the logical value of "1". Accordingly, the programming operation on the memory cell is unnecessary and it can be seen that the verification operation on the memory cell is completed.

However, when the memory cell is not normally programmed, the sense amplifier circuit 552 outputs the first data having the logical value of "0" and the first control block 557 implemented by the tristate buffer is disabled. Thus, the second data W_DATA stored in the write buffer 555 maintains the logical value of "0". Since the memory cell is not normally programmed, the chip controller 560 controls the nonvolatile memory device 520 to resume the programming operation on the memory cell.

Figure 7:
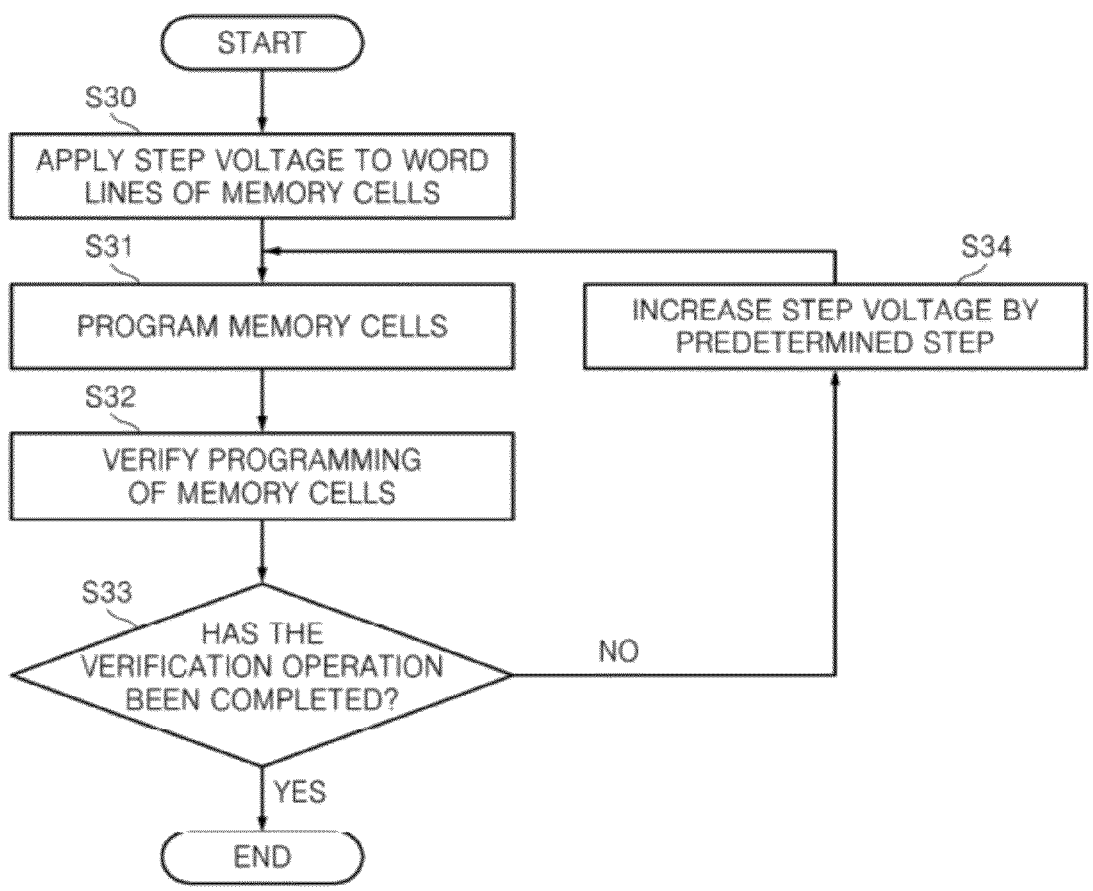
FIG. 7 is a flowchart illustrating the operation of a nonvolatile memory device according to an exemplary embodiment of the present inventive concept.

FIG. 7 is a flowchart illustrating the operation of the nonvolatile memory device 520 according to an exemplary embodiment of the present inventive concept. The operation of the nonvolatile memory device 520 will be described in detail with reference to FIGS. 5 and 7. The nonvolatile memory device 520 applies a step voltage having a predetermined level to the word lines of the memory cells included in the memory cell array 530 (Step S30). Then, the nonvolatile memory device 520 programs the memory cells based on the data received from the write driver circuit 554 (Step S31).

Next, the nonvolatile memory device 520 verifies whether the memory cells are normally programmed (Step S32) and determines whether the verification of all memory cells is completed (Step S33). When the verification of all memory cells is not completed (No, Step S33), the nonvolatile memory device 520 increases the step voltage applied to the word line of the memory cell that is not verified yet, by a predetermined step (Step S34) and then the memory cells may be programmed again (Step S31).

The degree of an increase in the step voltage may be determined considering the operation environment, for example, the characteristic of the nonvolatile memory device 520, a procedural change, and a surrounding environment. The operations of increasing the step voltage (Step S34), programming the memory cells (Step S31), and verifying the memory cells (Step S32) may be repeated until the verification of all memory cells is completed (Yes, Step S33).

Figure 8:
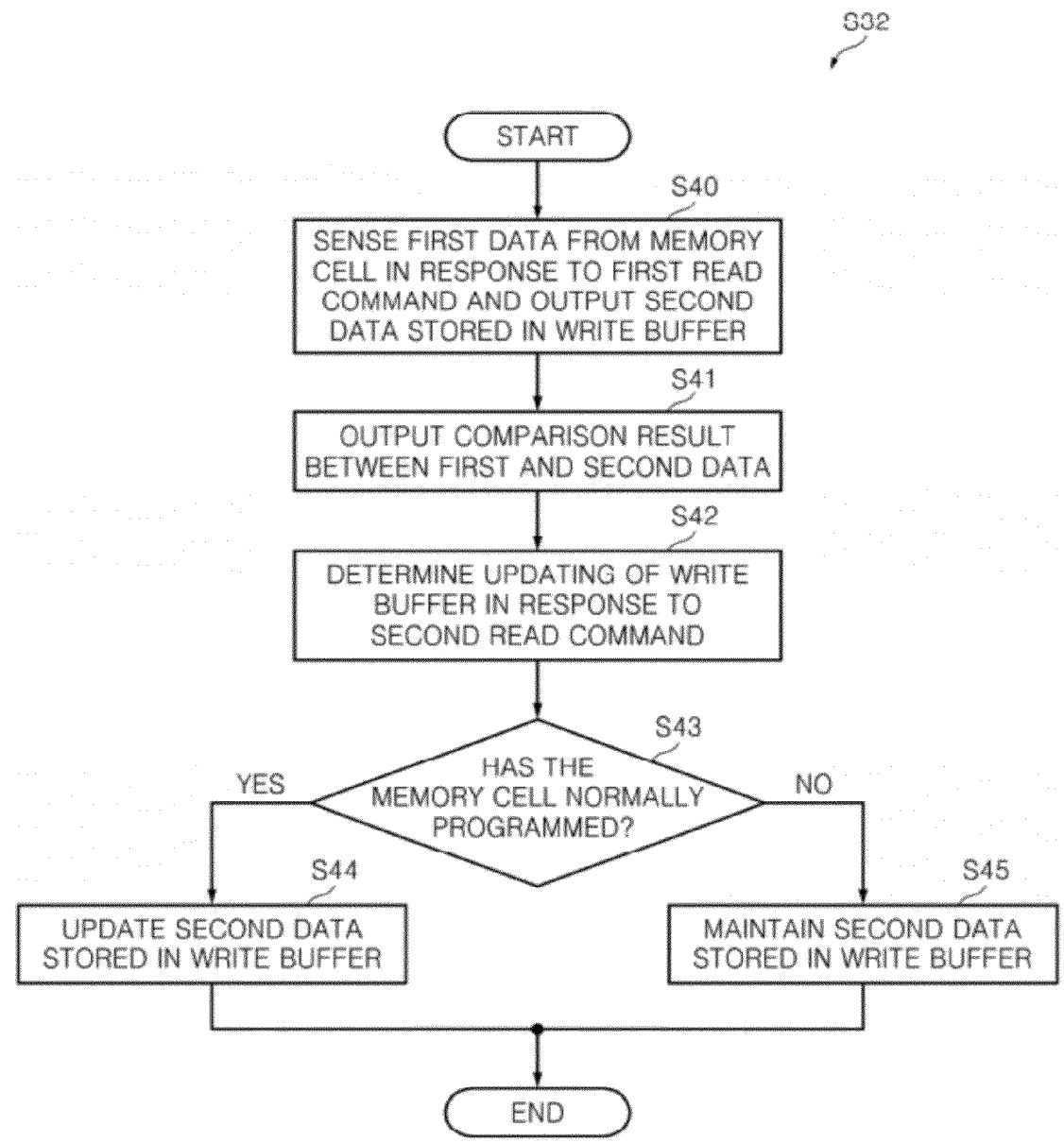
FIG. 8 is a flowchart illustrating the operation to verify whether or not the memory cell of FIG. 7 is programmed.

FIG. 8 is a flowchart illustrating the operation to verify whether or not the memory cell of FIG. 7 is programmed. The verification operation of the programming of the memory cells are described in detail below with reference to FIGS. 5, 6, and 8.

The sense amplifier circuit 551 senses the first data from the memory cell and outputs the sensed first data, in response to the first read command, and the write driver circuit 554 outputs the second data stored in the write buffer 555 (Step S40). Then, the verification block 556 and the comparison block 559 output a result of the comparison between the first and second data (Step S41). The memory controller 510 or the chip controller 560 may determine whether the memory cell is programmed based on the comparison result.

As described above with reference to FIGS. 5 and 6, it may be determined that the memory cell is normally programmed when the comparison result is the logical value "1" and the memory cell is not normally programmed when the comparison result is the logical value "0".

The nonvolatile memory device 520, in response to the second read command applied following the first read command, determines whether the write buffer 555 of the write driver circuit 554 is updated (Step S42). From there it is determined whether the memory cell had been normally programmed (Step S43). As described above with reference to FIGS. 5 and 6, when the logical value of the first data output from the sense amplifier circuit 551 is "1", the memory cell is determined to be normally programmed (Yes, Step S43). Thus, the second data having the logical value of "0" that is stored in the write buffer 555 is updated to have the logical value of "1" (Step S44).

However, when the logical value of the first data output from the sense amplifier circuit 551 is "0", the memory cell is not determined to be normally programmed (No, Step S43). Thus, the logical value of "0" that is stored in the write buffer 555 is maintained without change (Step S45). Therefore, the nonvolatile memory device 520 resumes the programming operation on the memory cell in the programming verification operation.

Nonvolatile memory 520 and/or memory controller 510 according to an exemplary embodiment of the present inventive concept may be embedded using various packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The non-volatile memory operation method according to some embodiments of the present inventive concept can also be embodied in hardware, software, firmware or combination thereof. When the method is embodied in software, it can be embodied as computer readable codes or programs on a computer readable recording medium. The computer readable recording medium may be any data storage device that can store data which can be thereafter read by a computer system. Examples of the computer readable recording medium may includes read-only memory (ROM), random-access memory (RAM), electrically erasable programmable ROM (EEPROM), and flash memory.

As described above, the nonvolatile memory device according to the present inventive concept may shorten the overall programming time by decreasing the time to verify whether a memory cell is programmed or not. Also, the nonvolatile memory device may not require a separate storage unit for the verification operation.

While the inventive concept has been particularly shown and described with reference to exemplary embodiments thereof, it will be understood that various changes in form and details may be made therein.

What is claimed is:

1. A nonvolatile memory device comprising:
   a sense amplifier circuit sensing first data from a memory cell via a bit line and outputting the sensed first data, in response to a read command;
   a write driver circuit programming the memory cell and storing second data indicating a state of programming of the memory cell, in response to a program command; and
   a verification block outputting a result of a comparison between the first and second data in response to a first section of the read command, and updating the second data based on the state of programming of the memory cell in response to a second section of the read command applied following the first section of the read command.

2. The nonvolatile memory device of claim 1, wherein the sense amplifier circuit comprises:
   a sense amplifier sensing the first data stored in the memory cell; and
   at least one first switching element selectively outputting the first data.

3. The nonvolatile memory device of claim 2, wherein the write driver circuit comprises:
   a write buffer storing the second data; and
   at least one second switching element selectively outputting the first data from the verification block to the write buffer.

4. The nonvolatile memory device of claim 3, wherein the verification block comprises:
 a comparison block receiving and comparing the first and second data and outputting a result of the comparison; and
 a control block selectively outputting the first data to the write buffer based on a logical value of the first data and a control signal.

5. The nonvolatile memory device of claim 4, wherein the comparison block comprises a logic gate performing an OR operation on the first and second data.

6. The nonvolatile memory device of claim 4, wherein the control block outputs the first data to the write buffer when the logical value of the first data is a first predetermined logical value and the control signal is active, and blocks the first data from being outputted to the write buffer when a logical value of the second data is a second predetermined logical value.

7. The nonvolatile memory device of claim 6, wherein the control block comprises:
 a first control block selectively outputting the first data based on the logical value of the first data; and
 a second control block selectively outputting the first data from the first control block to the write buffer in response to the control signal.

8. The nonvolatile memory device of claim 7, wherein the first control block comprises a third switching element which is switched in response to the logical value of the first data, and wherein the second control block comprises a fourth switching element which is switched in response to the control signal.

9. The nonvolatile memory device of claim 7, wherein, when the nonvolatile memory device performs a verification operation, an active section of the read command, a short-circuited section of the at least one first switching element, and a short-circuited section of the at least one second switching element are the same, and an active section of the control signal is included in an active section of the second section of the read command.

10. A semiconductor memory system comprising:
 a central processing unit (CPU);
 a system memory;
 a system bus; and
 a nonvolatile memory device comprising:
 a sense amplifier circuit sensing first data from a memory cell via a bit line and outputting the sensed first data;
 a write driver circuit programming the memory cell and storing second data indicating a state of programming of the memory cell, in response to a program command; and
 a verification block outputting a result of a comparison between the first and second data in response to a first read command, and updating the second data based on the state of programming of the memory cell in response to a second read command applied following the first read command.

11. The semiconductor memory system of claim 10, wherein the sense amplifier circuit comprises:
 a sense amplifier sensing the first data stored in the memory cell; and
 at least one first switching element selectively outputting the first data.

12. The semiconductor memory system of claim 11, wherein the write driver circuit comprises:
 a write buffer storing the second data; and
 at least one second switching element selectively outputting the first data from the verification block to the write buffer.

13. The semiconductor memory system of claim 12, wherein the verification block comprises:
 a comparison block receiving and comparing the first and second data and outputting a result of the comparison; and
 a control block selectively outputting the first data to the write buffer based on a logical value of the first data and a control signal.

14. The semiconductor memory system of claim 13, wherein the comparison block comprises a logic gate performing an OR operation on the first and second data.

15. The semiconductor memory system of claim 13, wherein the control block outputs the first data to the write buffer when the logical value of the first data is a first predetermined logical value and the control signal is active, and blocks the first data from being outputted to the write block when the logical value of the second data is a second predetermined logical value.

16. The semiconductor memory system of claim 15, wherein the control block comprises:
 a first control block selectively outputting the first data based on the logical value of the first data; and
 a second control block selectively outputting the first data from the first control block to the write buffer in response to the control signal.

17. The semiconductor memory system of claim 16, wherein the first control block comprises a third switching element which is switched in response to the logical value of the first data, and wherein the second control block comprises a fourth switching element which is switched in response to the control signal.

18. A method for programming a nonvolatile memory device, comprising:
 sensing a first data from a memory cell via a bit line using a sense amplifier circuit and outputting the sensed first data in response to a read command;
 programming the memory cell using a write driver circuit and storing second data including a state of programming of the memory cell, in response to a program command; and
 outputting a result of a comparison between the first and second data in response to a first section of the read command, using a verification block, and updating the second data based on the state of programming of the memory cell in response to a second section of the read command that is applied following the first section of the read command.

19. The method of claim 18, wherein the sense amplifier circuit senses the first data stored in the memory cell and selectively outputs the first data using at least one first switching element.

20. The method of claim 19, wherein the write driver circuit stores the second data using a write buffer and selectively outputs the first data from the verification block to the write buffer using at least one second switching element.

* * * * *